(12) United States Patent
Celano et al.

(10) Patent No.: US 10,541,108 B2
(45) Date of Patent: Jan. 21, 2020

(54) METHOD AND APPARATUS FOR TRANSMISSION ELECTRON MICROSCOPY

(71) Applicant: IMEC VZW, Leuven (BE)

(72) Inventors: Umberto Celano, Kessel-Lo (BE); Kristof Paredis, Oud-Heverlee (BE); Wilfried Vandervorst, Mechelen (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/899,905

(22) Filed: Feb. 20, 2018

(65) Prior Publication Data
US 2018/0240642 A1    Aug. 23, 2018

(30) Foreign Application Priority Data
Feb. 21, 2017 (EP) .................... 17157161

(51) Int. Cl.
| | |
|---|---|
| *H01J 37/28* | (2006.01) |
| *B82Y 40/00* | (2011.01) |
| *H01J 37/22* | (2006.01) |
| *H01J 37/304* | (2006.01) |
| *H01J 37/305* | (2006.01) |

(52) U.S. Cl.
CPC ........... *H01J 37/222* (2013.01); *H01J 37/28* (2013.01); *H01J 37/304* (2013.01); *H01J 37/3053* (2013.01); *H01J 2237/2802* (2013.01); *H01J 2237/31745* (2013.01)

(58) Field of Classification Search
CPC ......... H01J 37/3056; H01J 2237/31745; H01J 2237/2802; H01J 2237/26; H01J 2237/282; G01N 1/32; G01N 1/28; G01N 1/06; G01N 2001/2873; B82Y 40/00
USPC .............. 250/307, 311, 492.21, 304, 440.11, 250/442.11, 491.1; 850/18
See application file for complete search history.

(56) References Cited

U.S. PATENT DOCUMENTS

| | | | |
|---|---|---|---|
| 6,864,483 | B2 | 3/2005 | Olin |
| 9,177,760 | B2 | 11/2015 | Blackwood et al. |
| 10,068,749 | B2 * | 9/2018 | Fuller ................. H01J 37/3026 |
| 2015/0348752 | A1 | 12/2015 | Foord et al. |
| 2016/0133822 | A1 | 5/2016 | Chen et al. |

FOREIGN PATENT DOCUMENTS

| | | |
|---|---|---|
| CN | 102520212 B | 10/2013 |
| CN | 104150433 B | 3/2016 |
| CN | 104237567 B | 5/2016 |

OTHER PUBLICATIONS

J Y Huang et al. "Microstructure of nanoscratched semiconductors", 2011 J. Phys.: Conf. Ser. 326 012061, p. 1-3. (Year: 2011).*

(Continued)

*Primary Examiner* — David A Vanore
(74) *Attorney, Agent, or Firm* — McDonnell Boehnen Hulbert & Berghoff LLP

(57) ABSTRACT

The disclosure is related to a method and apparatus for transmission electron microscopy wherein a TEM specimen is subjected to at least one thinning step by scratching at least an area of the specimen with an SPM probe, and wherein the thinned area is subjected to an SPM acquisition step, using the same SPM probe or another probe.

16 Claims, 3 Drawing Sheets

(56) References Cited

OTHER PUBLICATIONS

K. Anatheshwara, "In Situ Transmission Electron Microscope Triboprobe for Tribological Studies of Materials at Nanoscale", Dept. of Mechanical Engineering, Indian Institute of Science, Jul. 2011, p. 80-104. (Year: 2011).*
Takagi et al., "TEM and HRTEM Observations of Microstructural Change of Silicon Single Crystal Scratched under Very Small Loading Forces by AFM", Materials Transactions, vol. 49, No. 6 (2008) pp. 1298 to 1302 (Year: 2008).*
European Search Report, European Patent Application No. 17157161. 5, dated Sep. 8, 2017, 25 pages.
European Search Report, European Patent Application No. 17157161. 5, dated Dec. 12, 2017, 18 pages.
Efimov, Anton E. et al., "Atomic Force Microscope (AFM) Combined With the Ultramicrotome: A Novel Device for the Serial Section Tomography and ARM/TEM Complementary Structural Analysis of Biological and Polymer Samples", Journal of Microscopy. vol. 226, Issue 3, Jun. 1, 2007, pp. 207-117.
Alekseev, Alexander et al., "Three-Dimensional Imaging of Polymer Materials by Scanning Probe Tomography", European Polymer Journal, vol. 52, Jan. 11, 2014, pp. 154-165.
Beard, J.D. et al., "An Atomic Force Microscope Nanoscalpel for Nanolithography and Biological Applications", Nanotechnology, vol. 20, No. 44, Nov. 4, 2009, pp. 1-10.
Vandervorst, W. et al., "Dopant, Composition and Carrier Profiling for 3D Structures", Materials Science in Semiconductor Processing, vol. 62, May 2017, pp. 31-48.
Celano, Umberto, "7.3.1 Improving Scalpel SPM", Metrology and Physical Mechanisms in New Generation Ionic Devices, 2016, Springer International Publishing, pp. 159-160.
"Transparently Combining SEM, TEM & FIBs With AFM/SPM & NSOM", A Nanonics Imaging Solution, Issue 2.3, Dec. 1, 2002, http://www.htskorea.com/technote7/data/board/kkkinfo5/file_in_body/1/semtem.pdf, 4 pages.

* cited by examiner

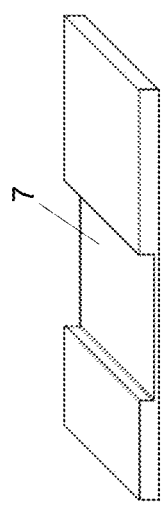
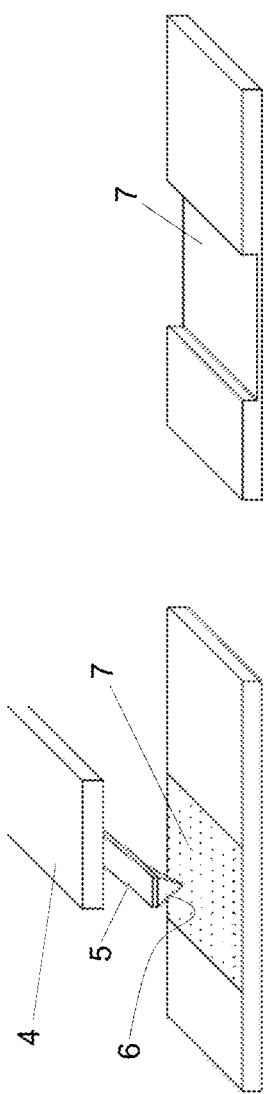
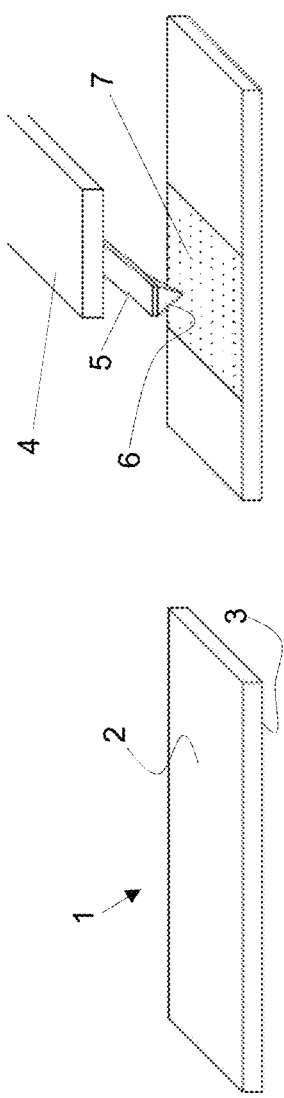
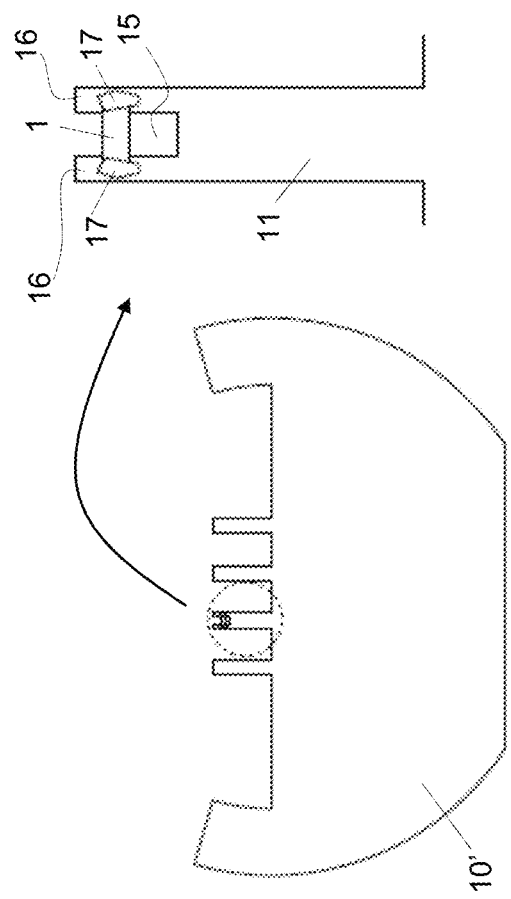
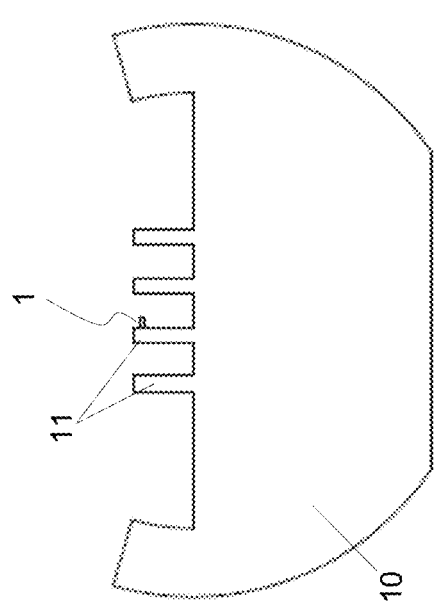
FIG. 1a
FIG. 1b
FIG. 1c
FIG. 2a
PRIOR ART
FIG. 2b

METHOD AND APPARATUS FOR TRANSMISSION ELECTRON MICROSCOPY

CROSS-REFERENCE TO RELATED APPLICATIONS

The present application is a non-provisional patent application claiming priority to European Patent Application No. 17157161.5, filed Feb. 21, 2017, the contents of which are hereby incorporated by reference.

FIELD OF THE DISCLOSURE

The present disclosure is related to the analysis of thin material specimens by transmission electron microscopy (TEM). In the present context, the name TEM includes classic transmission electron microscopy which involves the exposure of a specimen to a large-diameter electron beam, as well as STEM (Scanning TEM) wherein the specimen is scanned by a fine focused beam.

BACKGROUND

Transmission electron microscopy has been applied extensively in the study of nano-scaled structures manufactured in the semiconductor industry. In standard TEM, a large diameter electron spot is used on the specimen and images are projected through an electro-magnetic lens system and captured on a fluorescent screen combined with a CCD camera. In STEM, the specimen is scanned by a fine focused beam and the image is built up synchronously on the basis of transmitted electrons scattered over a range of angles and captured in different angular ranges by dedicated detectors.

Another technique that is known for the analysis of semiconductor devices is Scanning Probe Microscopy (SPM). An example of SPM is Atomic Force Microscopy (AFM), wherein a probe tip that is in contact with the surface of the specimen is scanned over an area of the surface. The tip may be a diamond tip of nano-scaled dimensions, allowing the acquisition of electrical, magnetic, and topographical data from the surface. Other SPM variations are known, all of them involving the use of a probe tip that is scanned over a surface, either in contact mode or in non-contact mode.

The use of SPM probes for scratching a surface and thereby thinning the surface is known as the "Scalpel SPM" technique. By performing consecutive SPM acquisitions on the progressively thinned specimen, a tomographic model may be obtained of the structural and electrical characteristics of a specimen.

3D-tomographic structural data of nano-scaled structures may be also obtained through TEM and in particular through the STEM technique. This is done by tilting the specimen about an axis perpendicular to the beam direction, through a range of tilt angles, allowing one to obtain a sequence of 2D-images of the specimen. The set of 2D-images acquired in the tilt series is then processed by back-projection algorithms which take into account the respective tilting angles and reconstruct the 3D volume of the specimen. The acquisition of the tilt series and the processing of the data is however technically complex.

TEM and SPM are performed on specific specimens, designed, and dimensioned for the purpose of the respective technique. TEM specimens are thin as they need to be electron transparent, whereas contact mode-SPM specimens are more robust given the loads applied to the specimen by the tip. A combination of TEM and SPM has been documented only in very particular cases, as illustrated for example by document U.S. Pat. No. 6,864,483, where TEM is used to study the indentation caused by an AFM probe on an AFM specimen.

One problem that is particular to TEM is the fact that the production of TEM specimens of extremely low thickness is difficult. Milling by Focused Ion Beam (FIB) generally does not allow to thin the specimen to less than about 100 nm, unless complex and costly process steps are applied, such as described for example in U.S. Pat. No. 9,177,760 where a specimen is thinned by FIB to less than 20 nm. The process however involves multiple complex manipulations of the specimen.

SUMMARY

The present disclosure aims to present a method and apparatus that makes it possible to overcome the above-described problems. This is achieved by the method and apparatus as disclosed in the appended claims. The disclosure is related to a method and apparatus for transmission electron microscopy wherein a TEM specimen is subjected to at least one thinning step by scratching an area of the specimen with an SPM probe and wherein the thinned area is subjected to an SPM acquisition step, using the same SPM probe or another probe. The method allows thinning the specimen to very low thickness without requiring complex operations. Consecutive TEM image data obtained on a progressively thinned specimen allows one to obtain 3D tomographic data of the specimen without requiring back projection algorithms.

The disclosure is firstly related to a method for performing transmission electron microscopy (TEM) on a TEM specimen, wherein:
  at least an area of the specimen is thinned by scratching a surface of the specimen with a probe suitable for Scanning Probe Microscopy (SPM),
  an SPM acquisition step is performed on the thinned area,
  the thinned area is exposed to an electron beam and a TEM image is taken of the thinned area.

According to an example embodiment, the thinning step is preceded by:
  the steps of exposing the area of the specimen that is to be thinned to an electron beam and taking a first TEM image of the area, and/or
  performing a first SPM acquisition step on the area that is to be thinned.

After the SPM acquisition step and after the taking of a TEM image, the thinning step may be repeated one or more times, each time followed by (not necessarily in that order): a further SPM acquisition step and the taking of a further TEM image of the progressively thinned area.

In the latter case, the method may further comprise:
  determining 3-dimensional data of the specimen on the basis of the consecutive TEM images, and
  building a tomographic model of the electrical and/or magnetic features of the specimen on the basis of the data acquired by the consecutive SPM acquisition steps.

According to an example embodiment, the SPM acquisition step is performed simultaneously with the thinning step, by the SPM probe applied for thinning the specimen.

Alternatively, the SPM acquisition step may be performed after the thinning step, by the probe applied in the thinning step or by another probe suitable for SPM.

According to an example embodiment, the method steps are performed on a lamella-shaped specimen that is attached to a TEM grid mounted in a TEM specimen holder. The TEM grid may comprise a pillar-shaped feature provided with a slit in the longitudinal direction of the feature, so as to form two leg portions on either side of the slit, and wherein the specimen is positioned transversally to the slit, and is attached to the two leg portions.

According to an example embodiment, the TEM step, the SPM acquisition step, and the thinning step are performed in a transmission electron microscope equipped with an SPM tool for thinning the sample and possibly a second SPM tool for performing the SPM acquisition step. In the latter case, the specimen may positioned only once and remain in place during the thinning step(s), the SPM acquisition step(s), and the TEM step(s).

The disclosure is equally related to an apparatus suitable for performing the method of the disclosure, comprising a transmission electron microscope and an SPM tool configured to thin a 2-dimensional area of a TEM specimen by scratching a surface of the specimen, while the specimen is mounted in the microscope in a manner that allows the taking of a TEM image of the area.

The apparatus may further comprise a second SPM tool for performing an SPM acquisition on the thinned area of the TEM specimen.

According to an example embodiment, the apparatus further comprises a control unit comprising a memory provided with a computer program for executing at least the following steps, when run on the control unit:
  thinning an area of a specimen,
  taking a TEM image of the thinned area and storing the TEM image data, and
  performing an SPM acquisition on the thinned area and storing the acquired data.

The disclosure is equally related to a computer program product configured to run on a control unit and execute the steps set out in the previous paragraph.

The disclosure is equally related to a TEM grid for holding a lamella-shaped TEM specimen, the grid having a pillar-shaped feature provided with a slit in the longitudinal direction of the feature, so as to form two leg portions on either side of the slit, wherein the leg portions are configured to support the specimen with the majority of the specimen being positioned over the slit.

BRIEF DESCRIPTION OF THE FIGURES

The above, as well as additional, features will be better understood through the following illustrative and non-limiting detailed description of example embodiments, with reference to the appended drawings.

FIGS. 1a, 1b, and 1c illustrate the thinning step applied to a TEM specimen in accordance with example embodiments of the method of the disclosure.

FIG. 2a illustrates a conventional TEM specimen grid. FIG. 2b shows the same specimen grid adapted for use in an example embodiment of the method of the disclosure.

Figure 3:
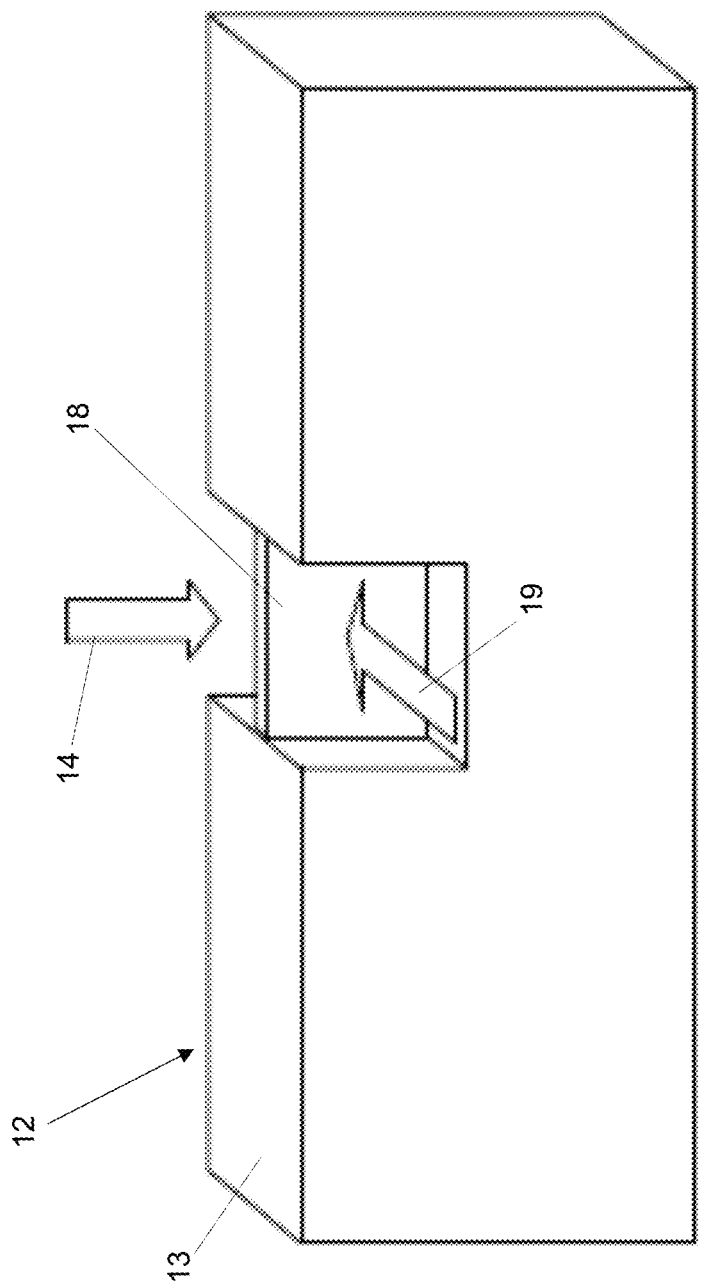
FIG. 3 illustrates a conventional H-bar TEM specimen, shown as an example of a TEM specimen applicable in an example embodiment of the method and apparatus of the disclosure.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The method of the disclosure includes a step of thinning a TEM specimen by scratching the specimen with an SPM probe. A TEM specimen is defined as a specimen comprising at least one planar portion that is electron-transparent, i.e., the planar portion has a thickness that allows it to be imaged through electron transmission microscopy. An 'area of the specimen' is therefore to be understood as a 2-dimensional area of the planar portion of the specimen. A conventional TEM specimen type is a lamella-shaped specimen of electron-transparent thickness, in which case the specimen and the planar portion are one and the same. The specimen is prepared by a suitable technique, such as by milling by a high energy focused ion beam (FIB). FIG. 1a shows a lamella-shaped specimen 1, having an upper surface 2 and a lower surface 3. In an example embodiment, the thickness of the TEM specimen before thinning by AFM is in the order of 0.1 μm.

According to example embodiments of the disclosure, the specimen is subjected to thinning by scanning an AFM probe 4 (see FIG. 1b) comprising a probe tip 6, for example, a diamond tip, mounted on a cantilever 5, at high force over the area of interest of the TEM specimen, thereby scratching the surface and removing material. This allows the thinning of a specific area 7 of the specimen with nano-meter precision until a required physical thickness of for example 20 nm is achieved (see FIG. 1c). The forces applied during thinning and the type of probe that is used may be in accordance with the "scalpel SPM" technique. The thinning can be performed on the full surface of the planar portion of a specimen, or on one or more selected sub-areas.

The fact that it is possible to further thin down an already extremely thin TEM specimen in the above-described way is not self-evident. One way of bringing the thinning process into practice is by attaching a TEM specimen to a TEM grid that can be mounted in a standard TEM specimen holder. The TEM grid is configured to support the specimen in a way that allows it to be thinned by scratching with an SPM probe. A possible way of achieving this is illustrated in FIGS. 2a and 2b. FIG. 2a illustrates a conventional TEM grid known as a "lift-out TEM grid." It is a half-disc 10 formed of a material, often copper, that is suitable for attaching a TEM specimen thereto. The disc is provided with pillar-shaped structures 11 to which a specimen may be attached. Typically this is a grid type for receiving specimens produced by "lift-out." In the lift-out technique, the specimen is first isolated from a substrate by focused ion beam etching. The specimen is then transported by a microprobe or the like, for example, attached to one short side of the rectangular lamella-shaped specimen, to the grid and attached with the opposite short side to one of the pillars of the grid, after which the microprobe is removed. The result is a specimen 1 that extends outward from the pillar, as illustrated in FIG. 2a. When the grid 10 is mounted in a TEM specimen holder which is in turn mounted in the TEM apparatus, the specimen is fully visible for the e-beam.

When the specimen is supported at one side only as illustrated in FIG. 2a, it lacks any significant mechanical resistance, and it would not be possible to subject the specimen to thinning with an AFM probe. One way of solving this is by using a modified grid 10' shown in FIG. 2b. The modified grid may be obtained by producing a small slit 15 in one of the pillars 11. The pillar 11 itself may have a width in the order of 10 μm. The slit 15 may have a width of between 1 and 5 μm depending on the size of the specimens to be investigated. The slit 15 may be produced by FIB milling. As illustrated by the detail shown in FIG. 2b, the specimen 1 is placed transversally to the slit 15 and anchored to the lateral leg portions 16 of the pillar on either side of the slit, by a suitable anchoring material, for example by two depositions 17 of Pt. The anchoring of a specimen by Pt is known. The specimen is now supported on both sides and it is thereby capable of withstanding the forces applied by an AFM probe configured to scratch and thin the surface in the manner illustrated in FIG. 1b. At the same time, because the specimen is placed over the open area of the slit 15, it is visible to the e-beam 24 without having to be manipulated after the thinning step.

The disclosure is not limited however to the use of lamella-shaped TEM specimens produced by the lift-out technique and attached to a TEM grid. Specimens produced by other techniques can be used in the disclosure, for example a conventional H-bar specimen is illustrated in FIG. 3. This H-bar specimen 12 is produced by FIB milling of a substrate 13 in the direction of the arrow 14, until a planar portion 18 is obtained that remains attached to the substrate on three sides. The specimen is then placed in a TEM holder and the planar portion 18 may be imaged through irradiation with an e-beam, directed according to arrow 19. As the planar portion 18 is supported on three sides, it can be thinned by SPM probe scratching in accordance with the disclosure.

The method of the disclosure comprises a step of acquiring electrical, magnetic, and/or topographical data on the thinned surface, hereafter referred to as an "SPM acquisition step." According to one example embodiment the SPM acquisition step uses the same tip that was used for thinning the specimen, wherein the electrical, magnetic, and/or topographical data are acquired simultaneously with the thinning operation. Alternatively, the acquisition takes place using the same tip, but subsequent to the thinning step. According to yet another alternative, the acquisition step takes place after the thinning step, and uses a different SPM tip. In the latter case, the choice of the tip may be adjusted to the function performed, for example a harder but larger tip for scratching/thinning and a finer tip for acquiring the data with optimal spatial resolution. Or the second SPM tip may be suitable for a non-contact type of SPM acquisition.

According to an example embodiment of the method, an SPM acquisition takes place on the underside of the thinned area (side 3 in FIG. 1), instead of or in addition to an SPM acquisition on the thinned surface 7 itself. The SPM acquisition on the underside may be useful to acquire changing electrical and/or magnetic characteristics of the specimen, as a function of the progressively reduced thickness. This may be realized in an apparatus provided with a first SPM probe for thinning the upper surface 2 of the specimen, and a second SPM probe for acquiring data from the underside 3.

According to another example embodiment of the method, the thinning step is performed on the two opposite surfaces of the specimen (surfaces 2 and 3 in FIG. 1). This may be done in an apparatus provided with a first SPM probe for thinning the upper surface 2 and a second SPM probe for thinning the lower surface 3. Possibly the thinning of both surfaces is performed simultaneously.

According to an example embodiment, a first TEM image is taken of an area that is to be thinned, prior to the actual thinning step. According to another example embodiment, a first SPM acquisition step is performed on the area that is to be thinned but without thinning the area, e.g., by using an AFM probe and applying a force that does not remove material from the surface, or by applying a non-contact SPM step. According to an example embodiment, both a first TEM image acquisition and a first non-thinning SPM acquisition are performed before the thinning step.

According to another example embodiment, the thinning step is repeated multiple times, each time followed by the taking of a TEM image of a progressively thinned area, and by an SPM acquisition step (unless the thinning and SPM acquisition are performed simultaneously). The specimen is maintained in a fixed position throughout this process, i.e., there is no tilting of the specimen and no acquisition of multiple TEM images at multiple specimen orientations. This embodiment allows one to obtain structural data of the specimen through the consecutive TEM images, as well as a 3D tomographic data set of the electrical and/or magnetic data of the specimen through the consecutive SPM acquisitions. In an example embodiment, thinning of the specimen takes place in small steps, for example of a few nm in each thinning step, in order to obtain a 3D model with high resolution. The thickness that is removed in each thinning step can be controlled by measuring the average height of the surface, for example after each scan of the (thinning) SPM probe across the area that is to be thinned, or after a given number of scans. The difference in measured heights indicates the thickness that has been removed. The measurement of the average height can be done by the SPM probe that is used for thinning, by performing a scan at a reduced (i.e., non-scratching) force, or by another SPM probe. When the required thickness has been removed, the TEM image is taken and a subsequent thinning step may be initiated. Therefore, the thickness of the material that is removed between two consecutive TEM images is known. This knowledge allows one to designate each TEM image obtained during the process to a particular depth of the initial specimen. Starting from the last TEM image, taken of the specimen thinned to the highest degree, it is therefore possible to detect the depth at which specific structures are embedded in the specimen, and to determine a 3D tomographic image of the structure, at least up to a given level within the specimen. This image may be obtained by conventional tomography techniques, for example known from tomography based on TEM images taken on thin slices of a specimen, produced by an ultramictrome. As some buried structures may remain visible in all of the TEM images taken at lesser depths, it may be difficult to build a full tomographic model of the imaged specimen area on the basis of the full set of images. Nevertheless, the TEM images do allow one to determine specific tomographic data of the imaged area, such as the shape of specific structures buried in the specimen. These data can be obtained at a high resolution given the low thickness of the removed layers.

In example embodiments, the tomographic data set is obtained without tilting the specimen and without applying back projection algorithms. The disclosure thus provides a straightforward way of obtaining the TEM-based tomographic data. Furthermore, in the conventional technique involving back projection algorithms, projection artifacts may be induced by overlapping buried objects. The present disclosure allows such problems to be overcome due to the physical removal of material. The removal of the layers by SPM also allows one to locally thin a selected area of the specimen, by scratching away the layers on the area of the specimen's surface. Contrary to existing techniques, the TEM images and therefore the tomographic data may thus be limited to very specific areas of the specimen.

The method of the disclosure may be performed by using existing tools and equipment, for example by using a TEM apparatus and an SPM apparatus and by transporting the specimen between these apparatuses for performing consecutive TEM and thinning and/or SPM acquisition operations. According to an example embodiment however, the steps of thinning the specimen, performing an SPM acquisition and taking a TEM image of the thinned area of the specimen are performed in a single apparatus. The apparatus as such is equally a feature of the present disclosure. This apparatus comprises a transmission electron microscope and at least one SPM tool configured to thin a 2-dimensional area of a TEM specimen by scratching a surface of the specimen, while the specimen is mounted in the microscope in a manner that allows the taking of a TEM image of the area. In other words, the SPM tool is capable of thinning an area of the specimen while it is positioned for the imaging by TEM of the area of the specimen. Still another way of describing the apparatus is that the SPM probe tip used for the thinning step, is pointing in the direction of the e-beam produced by an electron gun for imaging the thinned area. The apparatus is thereby distinguished from U.S. Pat. No. 6,864,483, where the AFM probe is oriented perpendicularly to the beam direction.

Figure 4:
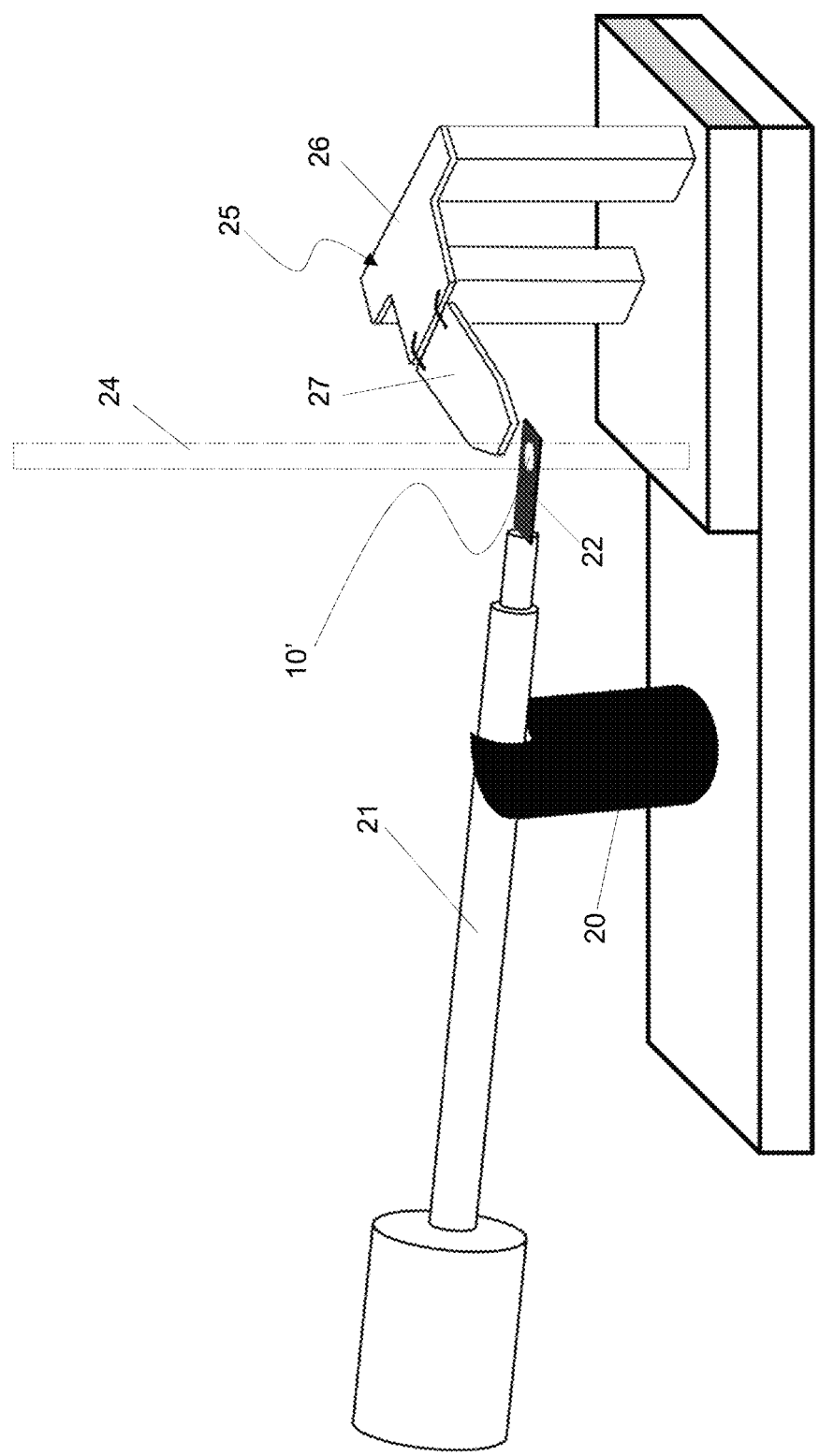
FIG. 4 illustrates the primary components in an apparatus according to an example embodiment of the disclosure.

FIG. 4 illustrates in a general and schematic way a possible configuration of the main components of an apparatus of the disclosure. The apparatus comprises a support 20 for positioning thereon a TEM specimen holder 21. The support 20 and TEM specimen holder 21 may be produced according to conventional technology. The holder 21 comprises a flat portion 22 into which a TEM grid, for example a grid 10' as shown in FIG. 2b may be inserted, and positioned with respect to an e-beam 24 produced by an electron gun (not shown). Adjacent to the support 20, an SPM tool 25 is mounted, comprising an SPM probe support 26, and an SPM probe 27, comprising a cantilever and tip (not visible in the drawing). The SPM tool is shown only in a schematic way, and is more complex in reality as will be clear to the skilled reader. The SPM tool as such may be built according to conventional technology provided that it can be integrated into the same apparatus together with the TEM holder 21. According to an example embodiment, the SPM probe 27 is a flat probe as shown in the drawing and known as such. The use of a flat probe is beneficial because a flat probe has reduced dimensions compared to other probe types, and can therefore be more easily integrated into the apparatus. The SPM tool 25 may be used for both the thinning step and the SPM acquisition step included in the method of the disclosure. Alternatively, the apparatus may comprise a second SPM tool (not shown), the first tool being dedicated for thinning, the second tool for the SPM acquisition by scanning the same surface thinned by the thinning SPM tool. Combined with a single or with two SPM tools for thinning/scanning the upper surface of a specimen, an additional SPM tool may be furthermore be included, configured to perform thinning and/or SPM acquisition on the underside of the specimen. All the SPM tools included in the apparatus of the disclosure may be configured to be able to perform the thinning and/or SPM acquisition steps described above while the specimen is under required vacuum conditions for the TEM imaging step. In other words, the SPM tool(s) is(are) mounted in a vacuum chamber of the apparatus.

In an example embodiment, the apparatus is configured so that positioning of the TEM specimen 1 with respect to the e-beam 24 takes place only once, and the specimen remains in place during the subsequent thinning, SPM acquisition and possible further TEM/thinning/acquisition steps. This means that the SPM tool 25 is configured so that the probe tip is displaceable into and out of a position wherein it can perform the thinning operation. According to other embodiments, the SPM thinning probe is stationary and the TEM holder 21 is displaceable into and out of a position wherein the SPM tool 25 can perform the thinning and SPM acquisition steps.

In an example embodiment, the apparatus of the disclosure is provided with an electronic control unit comprising a memory that is provided with a program for executing at least the steps of thinning an area of a TEM specimen, taking a TEM image of the thinned area and storing the TEM image data, performing an SPM acquisition on the thinned area and storing the acquired data, when the program is run on the control unit. The data may be stored on the memory itself or on electronic memory exterior to the apparatus, such as on a personal computer connected to the control unit by a data connection.

In an example embodiment, the program is furthermore configured to execute one or more of the following steps: positioning the specimen with respect to the TEM equipment and/or the SPM equipment included in the apparatus, controlling the thinning operation by measuring the average height of the thinned surface in between SPM scanning operations until a desired thickness reduction is reached, determining tomographic data of the structural features of the specimen and of the electrical and/or magnetic characteristics of the specimen. The disclosure is equally related to the computer program as such.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A method for performing transmission electron microscopy (TEM) on a TEM specimen, the method comprising:
    thinning at least an area of the TEM specimen by scratching a surface of the TEM specimen with a probe;
    performing, using the probe, a scanning probe microscopy (SPM) acquisition on the thinned area;
    exposing the thinned area to an electron beam; and
    taking a TEM image of the thinned area.

2. The method according to claim 1, further comprising:
    prior to the thinning, exposing the area of the TEM specimen to an electron beam and taking a first TEM image of the area.

3. The method according to claim 1, further comprising: after the SPM acquisition and after the taking of the TEM image of the thinned area, again thinning at least the area of the TEM specimen with the probe.

4. The method according to claim 3, further comprising maintaining the TEM specimen in a fixed position.

5. The method according to claim 1, wherein a thickness of the TEM specimen that is removed via the thinning is controlled by measuring an average height of the surface.

6. The method according to claim 1, further comprising:
determining 3-dimensional data of the TEM specimen based on the TEM image; and
building a tomographic model of electrical and/or magnetic features of the TEM specimen based on the data acquired by the SPM acquisition.

7. The method according to claim 1, wherein the SPM acquisition is performed simultaneously with the thinning.

8. The method according to claim 1, wherein the SPM acquisition is performed after the thinning.

9. The method according to claim 1, wherein the TEM specimen is a lamella-shaped specimen, the method further comprising attaching the TEM specimen to a TEM grid mounted in a TEM specimen holder.

10. The method according to claim 9, wherein the TEM grid comprises a pillar-shaped feature provided with a slit in a longitudinal direction of the pillar-shaped feature, so as to form two leg portions on either side of the slit, and wherein the TEM specimen is positioned transversally to the slit, and is attached to the two leg portions.

11. The method according to claim 1, wherein the TEM specimen is positioned only once and remains in place during the thinning, the SPM acquisition, and the taking of the TEM image.

12. The method of claim 1, further comprising:
prior to the thinning, performing a first SPM acquisition on the area of the TEM specimen.

13. An apparatus comprising a probe, the apparatus being configured to perform functions comprising:
thinning at least an area of a transmission electron microscopy (TEM) specimen by scratching a surface of the TEM specimen with the probe;
performing, using the probe, an SPM acquisition on the thinned area;
exposing the thinned area to an electron beam; and
taking a TEM image of the thinned area.

14. The apparatus of claim 13, further comprising a support for positioning thereon a TEM specimen holder.

15. The apparatus of claim 14, wherein the TEM specimen holder comprises a flat portion into which a TEM grid can be inserted.

16. A non-transitory computer readable medium storing instructions that, when executed by a processor of an apparatus, cause the apparatus to perform functions comprising:
thinning at least an area of a transmission electron microscopy (TEM) specimen by scratching a surface of the TEM specimen with a probe;
performing, using the probe, a scanning probe microscopy (SPM) acquisition on the thinned area;
exposing the thinned area to an electron beam; and
taking a TEM image of the thinned area.

* * * * *